United States Patent [19]
Ogawa

[11] Patent Number: 5,293,505
[45] Date of Patent: Mar. 8, 1994

[54] QUICK RESPONSE SOLID STATE RELAY HAVING A THYRISTOR DISCHARGE CIRCUIT AND A PHOTOTRANSISTOR

[75] Inventor: Kenji Ogawa, Tokyo, Japan

[73] Assignee: NEC Corporation, Tokyo, Japan

[21] Appl. No.: 23,377

[22] Filed: Feb. 26, 1993

[30] Foreign Application Priority Data

Feb. 26, 1992 [JP] Japan ................ 4-039813

[51] Int. Cl.[5] ............................. G02B 27/00
[52] U.S. Cl. ........................... 250/551; 307/311
[58] Field of Search ........... 250/551, 21 HA, 21 HR; 307/311, 305, 646, 643; 257/125, 146, 659

[56] References Cited

U.S. PATENT DOCUMENTS 3,723,769  3/1973  Collins ................. 250/551
4,419,586  12/1983  Phipps ................. 250/551

Primary Examiner—David C. Nelms
Assistant Examiner—Que T. Le
Attorney, Agent, or Firm—Sughrue, Mion, Zinn, Macpeak & Seas

[57] ABSTRACT

A solid state relay includes a light emitting diode receiving an input signal for emitting light, a photodiode array located to receive the emitted light for generating a photo voltage, a MOSFET having its gate connected to an anode of the photodiode array so as to receive the photo voltage. A source and a drain of the MOSFET are connected to a pair of output terminals, respectively, and an anode and a cathode of a thyristor are connected to the anode and a cathode of the photodiode array, respectively. A phototransistor is located to receive the emitted light. A collector and an emitter of the first phototransistor are connected to the cathode of the photodiode array and a positive gate of the thyristor, respectively. When the light emitting element is energized to emit the light, the phototransistor is turned on so as to turn off the thyristor. When the light emitting element is deenergized to emit no light, the phototransistor is turned off so as to turn on the thyristor.

8 Claims, 1 Drawing Sheet

QUICK RESPONSE SOLID STATE RELAY HAVING A THYRISTOR DISCHARGE CIRCUIT AND A PHOTOTRANSISTOR

BACKGROUND OF THE INVENTION

1. Field of the invention

The present invention relates to a solid state relay, and more specifically to a solid state relay having a MOSFET (metal-oxide-semiconductor field effect transistor) output circuit and a thyristor discharge circuit.

2. Description of related art

One typical example of conventional solid state relays have been disclosed in U.S. Pat. No. 4,754,175. For example, FIG. 3 of this U.S. patent shows a solid state relay including a light emitting diode (abbreviated "LED" hereinafter) 2, which has its anode and its cathode connected to a pair of input terminals 3 and 4, respectively, so that when an input electric signal is applied between the input terminals 3 and 4, the LED 2 emits light. In addition, there is provided an array 5 of series-connected photodiodes 6 located to receive the light emitted from the LED 2 so as to generate a photo voltage corresponding to the received light. An anode 7 of the photodiode at one end of the photodiode array 5 (simply called an "anode of the photodiode array 5" hereinafter) is connected to an anode of a diode 17, which in turn has its cathode connected to a gate of a MOSFET 9+10, so that the photo voltage generated by the photodiode array 5 is supplied through the diode 17 to the gate of the MOSFET. A source and a drain of the MOSFET are connected to a pair of output terminals 15 and 16, respectively.

The gate of the MOSFET is also connected to an anode 19 of a thyristor 18, which has its cathode 20 connected to a back gate of the MOSFET. In addition, a negative gate 21 of the thyristor 18 is connected to the anode of the diode 17, and a positive gate 22 of the thyristor 18 is connected to a cathode 8 of the photodiode at the other end of the photodiode array 5 (simply called a "cathode of the photodiode array 5" hereinafter). The cathode of the photodiode array 5 is also connected to a cathode of another diode 30, which has its anode connected to the cathode 20 of the thyristor 18. In this construction, the thyristor 18 and the diodes 17 and 30 cooperate to constitute a discharge circuit for discharging an electric charge accumulated on the gate of the MOSFET when the LED 2 is deenergized.

This solid state relay operates as follows: When the input voltage signal is applied between the input terminals 3 and 4, the LED 2 emits the light corresponding to the applied input signal. In response to the light emitted from the LED 2, the photodiode array 5 generates a corresponding photo voltage between its anode 7 and its cathode 8. With this photo voltage, a photo current flows through the diode 17 to the gate of the MOSFET, so that an electric charge is accumulated on the gate of the MSOFET. Thus, the MOSFET is turned on, so that a conductive path is formed between the output terminals 15 and 16.

On the other hand, if the LED 2 is deenergized, the voltage between the anode 7 and the cathode 8 of the photodiode array 5 drops due to a self discharge of the photodiode array 5, thereby to bias the positive gate 22 and the negative gate 21 in a forward direction. As a result, the thyristor 18 is turned on, so that the electric charge accumulated on the gate of the MSOFET is discharged through the thyristor 18, and therefore, the MOSFET is turned off.

Thus, this solid state relay can realize a high speed turning-off operation, since the electric charge accumulated on the gate of the MSOFET is discharged through the thyristor 18. In addition, an energy loss is small within the solid state relay circuit.

FIG. 5 of the above referred U.S. Pat. No. 4,754,175 also discloses another solid state relay in which the above mentioned diodes 17 and 30 are replaced with a pair of phototransistors 50 and 51, respectively, which are located to receive the light emitted from the LED 2. This modified solid state relay has not only the same advantage as that of the first mentioned solid state relay, but also another advantage in which the characteristics of the solid state relay can be modified by adjusting the photo sensitivity of the phototransistors 50 and 51.

In both of the above mentioned solid state relays, however, since the diode 17 or the phototransistor 50 are connected between the anode 7 of the photodiode array 5 and the gate of the MOSFET, a voltage drop occurs in the diode 17 or the phototransistor 50. Namely, a part of the photo voltage is lost in the diode 17 or the phototransistor 50.

In addition, when the amount of light received by the photodiode array 5 is small, the photo voltage generated between the anode 7 and the cathode 8 of the photodiode array 5 is correspondingly low. In this case, when the MOSFET is brought from the on condition into the off condition, the self discharge of the photodiode array 5 becomes slow, and therefore, a substantial time is required until the MOSFET is turned off.

Furthermore, the self discharge of the photodiode array 5 is dependent upon an internal resistance of the photodiode array 5. Therefore, the turning-off time greatly varies dependently upon variation in the internal resistance of the photodiode array 5.

SUMMARY OF THE INVENTION

Accordingly, it is an object of the present invention to provide a solid state relay which has overcome the above mentioned defects of the conventional ones.

Another object of the present invention is to provide a solid state relay so configured that a photo voltage generated by a photodiode array is applied to a gate of a MOSFET with a minimized loss, and a turning-off time is short independently of variation in the internal resistance of the photodiode array, so that a desired sensitivity can be easily obtained.

The above and other objects of the present invention are achieved in accordance with the present invention by a solid state relay comprising a light emitting element receiving an input signal for emitting light, a photodiode array located to receive the light emitted from the light emitting element for generating a photo voltage corresponding to the received light, a MOSFET having its gate connected to an anode of the photodiode array so as to receive the photo voltage, a source and a drain of the MOSFET being connected to first and second output terminals, respectively, a thyristor having its anode and its cathode connected to the anode and a cathode of the photodiode array, respectively, and a phototransistor located to receiving the light emitted from the light emitting element and connected between the cathode of the photodiode array and a positive gate of the thyristor, for turning off the thyristor when the light emitting element is energized to emit the light and for turning on the thyristor when the light emitting element is deenergized to emit no light.

The above and other objects, features and advantages of the present invention will be apparent from the following description of preferred embodiments of the invention with reference to the accompanying drawings.

DESCRIPTION OF THE PREFERRED EMBODIMENTS

Figure 1:
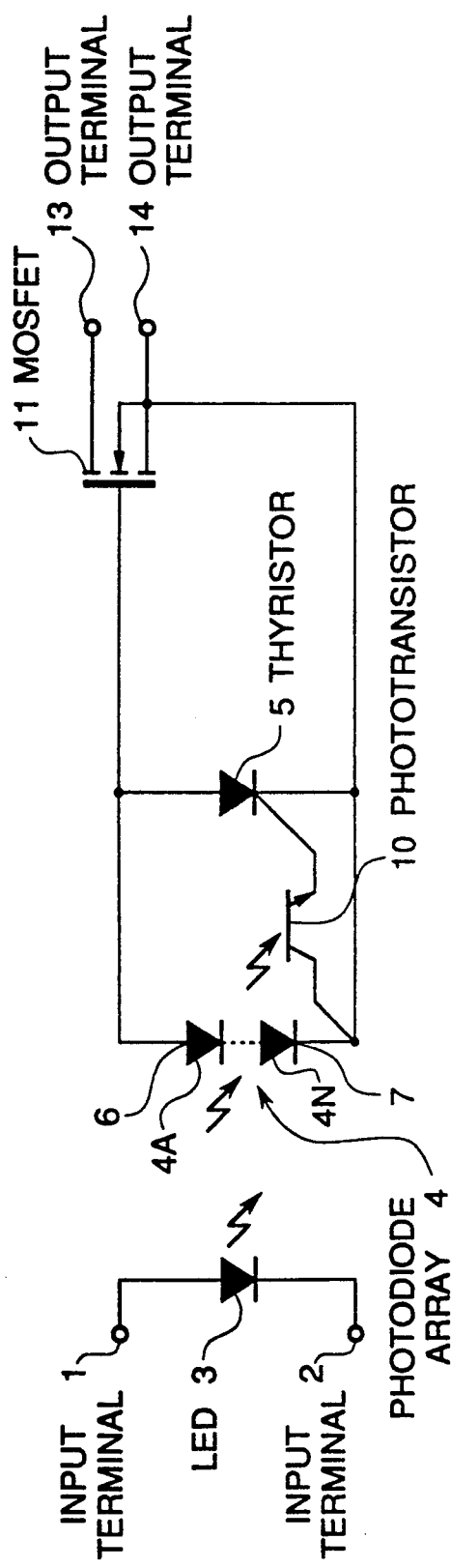
FIG. 1 is a circuit diagram of a first embodiment of the solid state relay in accordance with the present invention.

Referring to FIG. 1, there is shown a circuit diagram of a first embodiment of the solid state relay in accordance with the present invention.

The shown solid state relay includes a LED 3 having its anode connected to a first input terminal 1 and its cathode connected to a second input terminal 2. Therefore, when an input electric signal is applied between the first and second input terminals 1 and 2, the LED 3 emits a corresponding light. The light emitted from the LED 4 is given to a photodiode array 4 and a phototransistor 10.

The photodiode array 4 is composed of a number of series-connected photodiodes 4A to 4N. An anode 6 of the photodiode array 4, namely, an anode of the photodiode 4A at one end of the photodiode array 4, is connected directly to a gate of a MOSFET 11 and an anode of a thyristor 5. A source and a drain of the MOSFET 11 are connected to first and second output terminals 13 and 14, respectively. A cathode of the thyristor 5 is connected to the second output terminal 14 and to a cathode 7 of the photodiode array 4, namely, a cathode of the photodiode 4N at the other end of the photodiode array 4. A collector of the phototransistor 10 is connected to the cathode 7 of the photodiode array 4, and an emitter of the phototransistor 10 is connected to a positive gate of the thyristor 5.

The above mentioned solid state relay operates as follows:

When the input electric signal is applied between the first and second input terminals 1 and 3 so as to energize the LED 3 so that the LED 3 emits light, a photo voltage is generated between the anode 6 and the cathode 7 of the photodiode array 4. At this time, the phototransistor 10 is turned on by the light emitted by the LED 3, and therefore, the thyristor 5 is turned off. With this condition, a photo current flows form the anode 6 of the photodiode array 4 to the gate of the MOSFET 11, so that an electric charge is accumulated on the gate of the MOSFET 11, and therefore, the MOSFET 11 is brought into an on condition. Thus, a conductive path is formed between the first and second output terminals 13 and 14.

On the other hand, if the LED 3 is deenergized, internal carriers of the phototransistor 10 naturally disappear, and therefore, the phototransistor 10 is brought into an off condition as a matter of course. Accordingly, the positive gate of the thyristor 5 becomes a high impedance condition, and therefore, the thyristor 5 is brought into an on condition, regardless of a voltage condition of the photodiode array 4. As a result, the electric charge accumulated on the gate of the MOSFET 11 is quickly discharged through the thyristor 5, and accordingly, the MOSFET 11 is rapidly turned off.

In the above mentioned first embodiment, between the cathode 6 of the photodiode array 4 and the gate of the MOSFET 11 there is interposed no element such as a diode or a phototransistor which causes a voltage drop. Therefore, the photo voltage generated by the photodiode array 4 is applied to the gate of the MOSFET 11 with no substantial loss.

In addition, since the electric charge accumulated on the gate of the MOSFET 11 is discharged through the thyristor 5, the turning-off time of the MOSFET 11 is extremely short. Since the driving of the thyristor 5 is controlled by the phototransistor 10, the discharging time of the electric charge accumulated on the gate of the MOSFET 11 is independent of an internal resistance of the photodiode array 4, and therefore, is small in variation. Accordingly, the turning-off time of the MOSFET 11 is small in variation.

Furthermore, by adjusting the photo sensitivity of the phototransistor 10, the sensitivity and the characteristics of the solid state relay can be adjusted to the effect that the solid state relay responds to only the input signal having a level not less than a predetermined level. In this connection, the photo sensitivity of the phototransistor 10 can be adjusted by changing for an impurity diffusion concentration or the area of a photo reception region.

Figure 2:
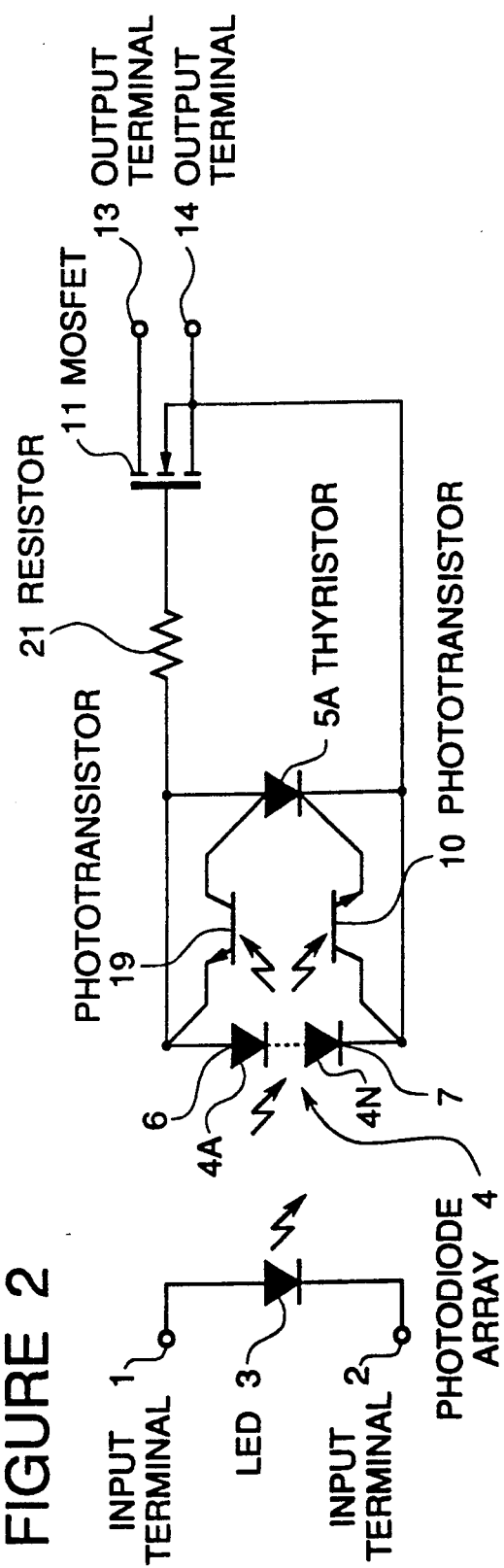
FIG. 2 is a circuit diagram of a second embodiment of the solid state relay in accordance with the present invention.

Referring to FIG. 2, there is shown a circuit diagram of a second embodiment of the solid state relay in accordance with the present invention. In FIG. 2, elements similar or corresponding to those shown in FIG. 1 are given the same Reference Numeral 5, and explanation thereof will be omitted.

Similarly to the first embodiment, the second embodiment of the solid state relay includes a LED 3 having its anode and its cathode connected to a first input terminal 1 and a second input terminal 2, respectively. The LED emits light corresponding to an input electric signal applied between the first and second input terminals 1 and 2, but the light emitted from the LED 4 is given not only to a photodiode array 4 and a phototransistor 10 but also to a phototransistor 19. In addition, a thyristor 5A is of a double gate type.

An anode 6 of the photodiode array 4 is connected to an anode of the thyristor 5A and one end of a resistor 21, which has its other end connected to a gate of a MOSFET 11. A source and a drain of the MOSFET 11 are connected to first and second output terminals 13 and 14, respectively. An emitter of the phototransistor 19 is connected to the anode 6 of the photodiode array 4, and a collector of the phototransistor 19 is connected to a negative gate of the thyristor 5A.

A cathode of the thyristor 5A is connected to the second output terminal 14 and to the cathode 7 of the photodiode array 4. An emitter of the phototransistor 10 is connected to a positive gate of the thyristor 5, and a collector of the phototransistor 10 is connected to the cathode 7 of the photodiode array 4.

The second embodiment of the solid state relay operates as follows:

When the LED 3 is energized to emit light, a photo voltage is generated between the anode 6 and the cathode 7 of the photodiode array 4. In addition, the phototransistors 10 and 19 are turned on by the light emitted by the LED 3, and therefore, the thyristor 5A is turned off. At this time, a photo current flows form the anode 6 of the photodiode array 4 to the gate of the MOSFET 11, so that an electric charge is accumulated on the gate of the MOSFET 11. Accordingly, the MOSFET 11 is brought into an on condition.

On the other hand, if the LED 3 is deenergized, internal carriers of the phototransistors 10 and 19 naturally disappear, and therefore, the phototransistors 10 and 19 are brought into an off condition as a matter of course. Accordingly, the positive gate and the negative gate of the thyristor 5A become a high impedance condition, and therefore, the thyristor 5A is brought into an on condition, regardless of a voltage condition of the photodiode array 4. As a result, the electric charge accumulated on the gate of the MOSFET 11 is quickly discharged, and accordingly, the MOSFET 11 is rapidly turned off.

In this second embodiment, accordingly, advantages similar to those obtained in the first embodiment can be obtained. In addition, since both the negative gate and the positive gate of the thyristor 5A are controlled in response to the on/off of the light emitted from the LED 3, the thyristor can operate more stably than the first embodiment, and the influence of noise can be more effectively suppressed.

In the above mentioned embodiments, since the electric charge accumulated on the gate of the MOSFET 11 is caused to be discharged by turning on the thyristor, the discharge of the electric charge is extremely quickly realized, and therefore, there may be a fear that because of the extremely quick discharge, noises occur and/or an abnormal voltage occurs in a load circuit, so that the MOSFET is damaged. In the second embodiment, however, since the resistor 21 is connected to the gate of the MOSFET so as to control the discharge current, it is possible to avoid the MOSFET from being damaged.

In the above mentioned embodiments, the output transistor is constituted of the single MOSFET 11. However, it is a matter of course that the single MOSFET 11 can be replaced with a pair of MOSFETs 9 and 10 shown in FIGS. 3 and 5 of U.S. Pat. No. 4,754,175 referred to hereinbefore.

The invention has thus been shown and described with reference to the specific embodiments. However, it should be noted that the present invention is in no way limited to the details of the illustrated structures but changes and modifications may be made within the scope of the appended claims.

I claim:

1. A solid state relay comprising a light emitting element receiving an input signal for emitting light, a photodiode array located to receive the light emitted from said light emitting element for generating a photo voltage corresponding to the received light, a MOSFET having its gate connected to an anode of said photodiode array so as to receive said photo voltage, a source and a drain of said MOSFET being connected to first and second output terminals, respectively, a thyristor having its anode and its cathode connected to said anode and a cathode of said photodiode array, respectively, and a first phototransistor located to receive the light emitted from said light emitting element and connected between said cathode of said photodiode array and a positive gate of said thyristor, for turning off said thyristor when said light emitting element is energized to emit the light and for turning on said thyristor when said light emitting element is deenergized to emit no light.

2. A solid state relay claimed in claim 1 wherein said light emitting element is a light emitting diode.

3. A solid state relay claimed in claim 1 wherein a collector of said first phototransistor is connected to said cathode of said photodiode array and an emitter of said first phototransistor is connected to said positive gate of said thyristor.

4. A solid state relay claimed in claim 1 wherein said thyristor is of a double gate type, and further including a second phototransistor located to receive the light emitted from said light emitting element and connected between said anode of said photodiode array and a negative gate of said thyristor, said first and second phototransistor cooperating to surely turn off said thyristor when said light emitting element is energized to emit the light and to surely turn on said thyristor when said light emitting element is deenergized to emit no light.

5. A solid state relay claimed in claim 4 wherein said gate of said MOSFET is connected through a resistor to said anode of said photodiode array and said anode of said thyristor.

6. A solid state relay claimed in claim 4 wherein a collector of said first phototransistor is connected to said cathode of said photodiode array and an emitter of said first phototransistor is connected to said positive gate of said thyristor, and wherein an emitter of said second phototransistor is connected to said anode of said photodiode array and a collector of said second phototransistor is connected to said negative gate of said thyristor.

7. A solid state relay claimed in claim 6 wherein said gate of said MOSFET is connected through a resistor to said anode of said photodiode array, said anode of said thyristor and said emitter of said second phototransistor.

8. A solid state relay claimed in claim 7 wherein said light emitting element is a light emitting diode.

* * * * *